(12) United States Patent
Kano (10) Patent No.: US 10,797,645 B2
(45) Date of Patent: Oct. 6, 2020

(54) CIRCUIT DEVICE, OSCILLATOR, ELECTRONIC APPARATUS, AND VEHICLE

(71) Applicant: Seiko Epson Corporation, Tokyo (JP)

(72) Inventor: Shinnosuke Kano, Minowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/516,426

(22) Filed: Jul. 19, 2019

(65) Prior Publication Data

US 2020/0028468 A1 Jan. 23, 2020

(30) Foreign Application Priority Data

Jul. 20, 2018 (JP) ................................. 2018-136291

(51) Int. Cl.
| | | |
|---|---|---|
| *H03B 5/04* | (2006.01) | |
| *H03B 5/36* | (2006.01) | |
| *H03B 5/06* | (2006.01) | |
| *H03L 1/02* | (2006.01) | |
| *G06F 1/24* | (2006.01) | |

(52) U.S. Cl.
CPC ................ *H03B 5/04* (2013.01); *G06F 1/24* (2013.01); *H03B 5/06* (2013.01); *H03B 5/36* (2013.01); *H03L 1/026* (2013.01); *H03L 1/028* (2013.01)

(58) Field of Classification Search
CPC . H03B 5/06; H03B 5/36; H03B 5/366; H03B 5/30; H03L 3/00; H03L 1/02; H03L 1/022; H03L 1/028; H03L 1/026; G06F 1/24; H03K 17/22
See application file for complete search history.

(56) References Cited

U.S. PATENT DOCUMENTS

| | | | | |
|---|---|---|---|---|
| 6,683,481 | B1* | 1/2004 | Zhou | H03K 17/223 327/143 |
| 7,436,227 | B2* | 10/2008 | Thomsen | H03L 1/022 327/147 |
| 9,214,897 | B2* | 12/2015 | Yoneyama | H03B 5/04 |
| 2006/0238216 | A1* | 10/2006 | Yada | G06F 1/08 326/3 |
| 2009/0066434 | A1 | 3/2009 | Isberg | |

FOREIGN PATENT DOCUMENTS

| | | |
|---|---|---|
| JP | H09-062396 A | 3/1997 |
| JP | 2006-285823 A | 10/2006 |
| JP | 2009-517905 A | 4/2009 |

* cited by examiner

*Primary Examiner* — Ryan Johnson
(74) *Attorney, Agent, or Firm* — Harness, Dickey & Pierce, P.L.C.

(57) ABSTRACT

A circuit device has a first mode in which the circuit device outputs a clock signal and a second mode in which the circuit device does not output the clock signal. The circuit device includes an oscillation circuit, a non-volatile memory in which characteristic adjustment data of the oscillation circuit is stored, a reset circuit generating a reset signal, and a storage circuit into which the characteristic adjustment data is loaded from the non-volatile memory when the reset signal transitions from active to inactive. When the circuit device shifts from the second mode to the first mode, the reset circuit causes the reset signal to transition from active to inactive.

13 Claims, 8 Drawing Sheets

CIRCUIT DEVICE, OSCILLATOR, ELECTRONIC APPARATUS, AND VEHICLE

The present application is based on, and claims priority from, JP Application Serial Number 2018-136291, filed Jul. 20, 2018, the disclosure of which is hereby incorporated by reference herein in its entirety.

BACKGROUND

1. Technical Field

The present disclosure relates to a circuit device, an oscillator, an electronic apparatus, a vehicle, and the like.

2. Related Art

A power-on reset circuit that reset-releases a circuit device upon power-on of the circuit device has been known. Moreover, a method for initializing the circuit device by loading setting data of the circuit device from a non-volatile memory into a register upon releasing the reset of the circuit device has been known. Moreover, a method for reducing a consumption current of the circuit device by setting the circuit device into a standby mode based on an enable signal input from a terminal or the like has been known.

For example, JP-T-2009-517905 discloses a technique for causing an oscillation device to return from the standby mode. In JP-T-2009-517905, the oscillation device includes an oscillator core, a capacitive loading unit coupled to the oscillator core, and a memory device. The memory device includes a first memory unit and a second memory unit, and is coupled to the capacitive loading unit. The first memory unit stores a first value supplied to the capacitive loading unit for controlling a capacitance value in a startup period of the oscillation device. The second memory unit stores a second value supplied to the capacitive loading unit for controlling the capacitance value in an operating period of the oscillation device. This makes startup control flexible and reduces complexity to allow an oscillator to be frequently switched to the standby mode.

JP-T-2009-517905 is an example of the related art.

The operation of the circuit device is stopped in the standby mode, and therefore, the consumption current can be reduced. However, in a case in which the operation of the power-on reset circuit is stopped in the standby mode, there is a problem in that the circuit device is not reset when an abnormality such as instantaneous interruption occurs. The instantaneous interruption is a phenomenon in which a power supply voltage supplied to the circuit device temporarily drops. When the instantaneous interruption occurs in the standby mode, there is a risk that the setting data stored in the register is broken. However, the circuit device is not reset, and therefore, the setting data is not reloaded from the non-volatile memory. For this reason, there is a risk that the operation of the circuit device restarts based on improper setting data upon returning from the standby mode.

For reducing the consumption current in the standby mode, it is desirable to stop the operation of the power-on reset circuit. However, the operation of the power-on reset circuit cannot be stopped for the reasons described above.

SUMMARY

One aspect of the present disclosure relates to a circuit device having a first mode in which the circuit device outputs a clock signal and a second mode in which the circuit device does not output the clock signal, the circuit device including: an oscillation circuit generating the clock signal; a non-volatile memory in which characteristic adjustment data of the oscillation circuit is stored; a reset circuit generating a reset signal; and a storage circuit into which the characteristic adjustment data is loaded from the non-volatile memory when the reset signal transitions from active to inactive, wherein the reset circuit causes the reset signal to transition from active to inactive when the circuit device shifts from the second mode to the first mode.

BRIEF DESCRIPTION OF THE DRAWINGS

FIG. 1 is a circuit diagram of a reset circuit for explaining operation at the time of power-on.

FIG. 2 is a waveform chart explaining the operation of the reset circuit at the time of power-on.

DESCRIPTION OF EXEMPLARY EMBODIMENTS

Hereinafter, preferred embodiments of the present disclosure will be described in detail. The embodiments described below do not unduly limit the details of the present disclosure set forth in the appended claims, and not all of the configurations described in the embodiments may necessarily be indispensable as solving means of the present disclosure.

1. Circuit Device

Figure 1:
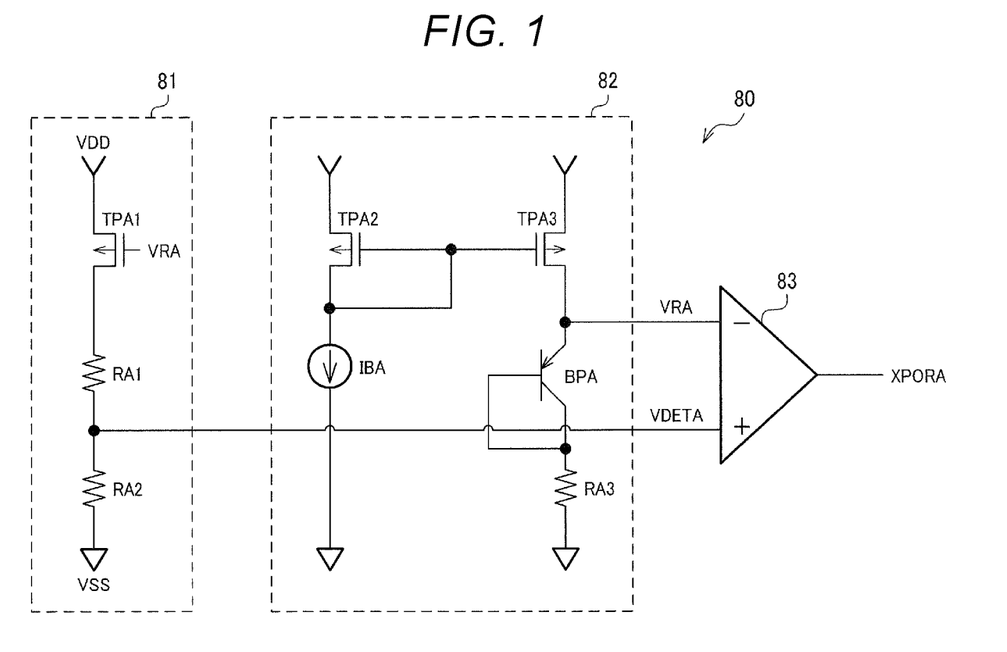
Figure 2:
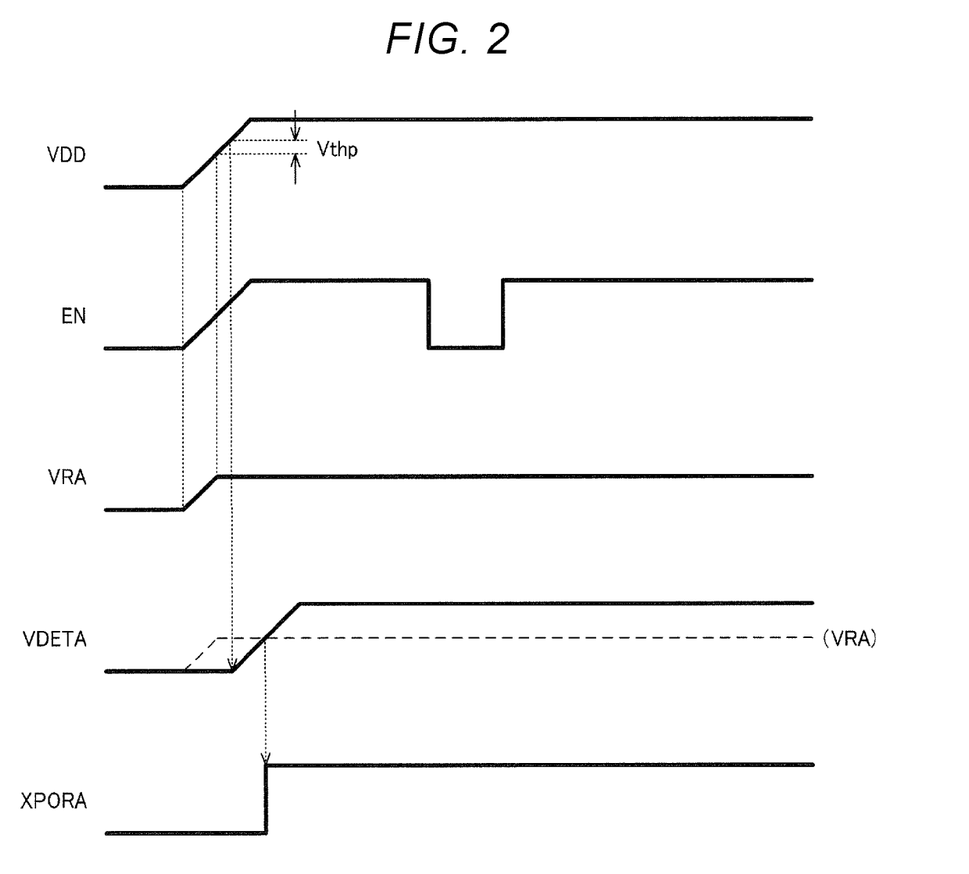

First, the operation of a reset circuit that reset-releases a circuit device upon power-on of the circuit device will be described. FIG. 1 is a circuit diagram of a reset circuit 80. FIG. 2 is a waveform chart explaining the operation of the reset circuit 80.

As shown in FIG. 1, the reset circuit 80 includes a voltage generating circuit 81 generating a voltage VDETA, a reference voltage generating circuit 82 generating a reference voltage VRA, and a comparator 83 comparing the voltage VDETA with the reference voltage VRA. The voltage generating circuit 81 includes a transistor TPA1 and resistors RA1 and RA2. The reference voltage generating circuit 82 includes transistors TPA2 and TPA3, a current source IBA, a bipolar transistor BPA, and a resistor RA3. The transistors TPA1 to TPA3 are P-type transistors.

The transistors TPA2 and TPA3 and the current source IBA constitute a current mirror circuit. As shown in FIG. 2, when a power supply voltage VDD supplied to the reset circuit 80 rises, a mirror current flowing to the transistor TPA3 gradually increases, and the reference voltage VRA rises. The reference voltage VRA rises to a voltage determined by a base-emitter voltage of the bipolar transistor BPA and a voltage drop of the resistor RA3.

The reference voltage VRA is input to a gate of the transistor TPA1. A threshold voltage of the transistor TPA1 is defined as Vthp. When the power supply voltage VDD reaches VRA+Vthp, the transistor TPA1 is turned on, and the voltage VDETA starts to rise. The voltage VDETA is a voltage obtained by dividing the power supply voltage VDD by the resistors RA1 and RA2. When the voltage VDETA exceeds the reference voltage VRA, an output signal of the comparator 83 transitions from a low level to a high level. This output signal is a reset signal XPORA. The reset signal XPORA is a reset signal of a circuit device including the reset circuit 80. That is, when the reset signal XPORA is at the low level, the circuit device is brought into a reset state; and when the reset signal XPORA is at the high level, the circuit device is brought into a reset release state. The reset state is a non-operating state of the circuit device. The reset release state is a state in which the reset state is released, that is, an operating state of the circuit device.

As will be described later with reference to FIG. 3, in a circuit device of the embodiment, a normal operating mode and a standby mode are switched based on a control signal EN. The control signal EN is also referred to as an "enable signal". In the standby mode, an analog circuit such as an oscillation circuit 10 is set into a disable state, so that a consumption current in the standby mode is reduced. It is assumed that the reset circuit 80 is applied to the circuit device described above. The reset circuit 80 is not controlled by the control signal EN, and therefore, the operation of the reset circuit 80 is enabled also in the standby mode. For this reason, a consumption current flows to the reset circuit 80 also in the standby mode, and therefore, the consumption current in the standby mode increases by that amount.

On the other hand, it is assumed that the reset circuit 80 is configured such that the reset circuit 80 can be set into the disable state in the standby mode. However, in the standby mode, setting data stored in a storage circuit 60 may be rewritten to incorrect data. For example, it is considered that the setting data is rewritten to incorrect data due to instantaneous interruption, noise, or the like. The oscillation circuit 10 operates based on the setting data stored in the storage circuit 60, and therefore, there is a risk that the oscillation circuit 10 operates based on the incorrect setting data upon returning from the standby mode.

Figure 3:
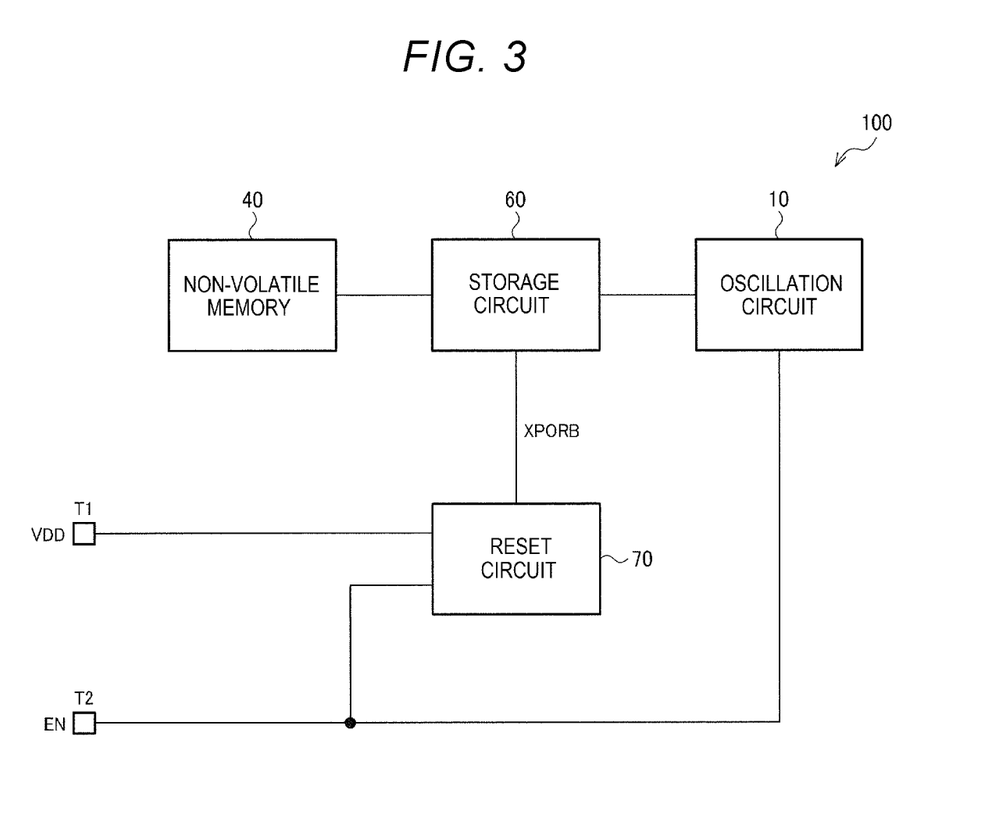
FIG. 3 is a configuration example of a circuit device in an embodiment.

FIG. 3 is a configuration example of a circuit device 100 of the embodiment. The circuit device 100 includes a non-volatile memory 40, the storage circuit 60, the oscillation circuit 10, a reset circuit 70, and terminals T1 and T2. The circuit device 100 is a circuit device that generates a clock signal with the oscillation circuit 10. The circuit device 100 is, for example, an integrated circuit device. When the circuit device 100 is the integrated circuit device, the terminals T1 and T2 are pads formed at a semiconductor substrate, or terminals of a package in which a semiconductor substrate is accommodated.

The non-volatile memory 40 is a non-volatile storage device, and is a device that can hold and store data even when power is not supplied. The non-volatile memory 40 includes a memory cell array, a driver circuit, and a read-write circuit. In the memory cell array, a plurality of memory cells, a plurality of word lines, a plurality of bit lines, a plurality of source lines, and the like are disposed. The driver circuit performs selection of the word line or the like, and performs driving of the word line or the source line. The read-write circuit is coupled to the bit line, and performs reading or wiring of data.

The non-volatile memory 40 is, for example, an electrically erasable programmable read-only memory (EEPROM), a flash memory, or the like. The EEPROM can be realized by, for example, a floating gate memory cell or the like. The flash memory can be realized by, for example, a metal-oxide-nitride-oxide-silicon (MONOS) memory cell or the like. Alternatively, the non-volatile memory 40 may be a memory using a fuse cell. In this type of memory, the fuse cell that is a memory cell includes a resistive element and a selector element coupled in series to the resistive element. The selector element is, for example, a P-N junction diode. However, the selector element may be a MOS transistor. For example, one end of the resistive element is coupled to the bit line, and the other end of the resistive element is coupled to an anode of the diode. A cathode of the diode is coupled to the word line. The resistive element functioning as a fuse element is a programmable resistor having a variable resistance value. For example, the resistive element includes a poly resistor having a high resistance value and a silicide formed at the upper layer of the poly resistor and having a low resistance value. The silicide is melt by feeding a large current through the silicide to change the resistance value of the resistive element from a low resistance value to a high resistance value, so that data is stored in the fuse cell that is a memory cell.

The storage circuit 60 is a volatile storage circuit, and is a circuit that can hold and store data when power is supplied. The storage circuit 60 is, for example, a register. Alternatively, the storage circuit 60 may be a volatile memory such as a static random-access memory (SRAM) or a dynamic random-access memory (DRAM). When the storage circuit 60 is the register, the storage circuit 60 includes a plurality of latch circuits that store data, and an address decoder that selects the latch circuit to be accessed by decoding an address. When the storage circuit 60 is the volatile memory, the storage circuit 60 includes a plurality of word lines, a plurality of bit lines, and a plurality of memory cells. Moreover, the storage circuit 60 can include a word line selecting circuit that selects the word line, a readout circuit that performs reading of data from the memory cell, and a writing circuit that performs writing control of data to the memory cell.

The oscillation circuit 10 is a circuit that generates an oscillation signal. For example, the oscillation circuit 10 is a circuit that generates an oscillation signal by oscillating a resonator. The oscillation circuit 10 may be an oscillation circuit in a simple packaged crystal oscillator (SPXO), an oscillation circuit in a temperature-compensated crystal oscillator (TCXO), or the like. When the oscillation circuit 10 is the oscillation circuit in a TCXO, the oscillation circuit 10 is a VCO. In this case, the circuit device 100 includes a temperature compensation circuit, and the temperature compensation circuit generates a control voltage of the VCO and thus compensates for the temperature characteristics of an oscillation frequency.

The reset circuit 70 is a power-on reset circuit. That is, the reset circuit 70 resets the circuit device 100 when power is turned on to the circuit device 100. Specifically, the reset circuit 70 causes a reset signal XPORB to transition from active to inactive when the power supply voltage VDD input to the terminal T1 exceeds a predetermined voltage. When the reset signal XPORB is active, the circuit device 100 is set into the reset state; and when the reset signal XPORB is inactive, the circuit device 100 is set into the reset release state. "Active" is also referred to as a "first logic level", and "inactive" is also referred to as a "second logic level".

The control signal EN is input to the control terminal T2. The control signal EN is a signal to switch between the normal operating mode and the standby mode of the circuit device 100 in a state in which power is supplied to the circuit device 100. When the control signal EN is active, the circuit device 100 is set into the normal operating mode; and when the control signal EN is inactive, the circuit device 100 is set into the standby mode. The standby mode is a state in which the operation of the circuit device 100 is stopped in a state in which the power supply voltage VDD is supplied to the terminal T1. Specifically, the oscillation circuit 10 and the reset circuit 70 are set into the disable state in the standby mode. The disable state is a state in which a consumption current of the circuit is reduced. Specifically, the disable state is a state in which the operation of the circuit is stopped by cutting off current supply from a power supply line to the circuit. It is not necessary to completely cut off the current supply to the circuit in the disable state. It is sufficient that the consumption current of the circuit in the disable state is reduced more than the consumption current of the circuit in the normal operating mode.

Hereinafter, the operation of the circuit device 100 will be described. Characteristic adjustment data of the oscillation circuit 10 is stored as setting data in the non-volatile memory 40. For example, at the time of manufacture of the circuit device 100 or at the time of manufacture of an electronic apparatus including the circuit device 100, the characteristic adjustment data is written to the non-volatile memory 40. When power is turned on to the circuit device 100, the reset circuit 70 causes the reset signal XPORB to transition from active to inactive. At this time, the characteristic adjustment data is read from the non-volatile memory 40, and the characteristic adjustment data is stored in the storage circuit 60. The oscillation circuit 10 operates based on the characteristic adjustment data stored in the storage circuit 60.

The characteristic adjustment data is data for adjusting the characteristics of the oscillation circuit 10. For example, when the oscillation circuit 10 is the oscillation circuit in a TCXO, the characteristic adjustment data is a parameter of a compensation function in the temperature compensation circuit. By setting the parameter of the compensation function, temperature characteristics of the oscillation frequency of the oscillation circuit 10 are adjusted. This parameter is stored as temperature compensation data in the non-volatile memory 40. Alternatively, the characteristic adjustment data may be data to set the frequency of the clock signal output by the oscillation circuit 10. The oscillation circuit 10 may include a frequency dividing circuit that divides the frequency of the oscillation signal or a PLL circuit that multiplies the oscillation signal. The characteristic adjustment data may be data to set a frequency division ratio of the frequency dividing circuit or a multiplication factor of the PLL circuit.

As described above, the reset circuit 70 is set into the disable state in the standby mode. At this time, the reset circuit 70 outputs the reset signal XPORB that is active, and the circuit device 100 is brought into the reset state. When the circuit device 100 shifts from the standby mode to the normal operating mode, the reset circuit 70 causes the reset signal XPORB to transition from active to inactive. With this configuration, the circuit device 100 transitions from the reset state to the reset release state.

According to the embodiment, when the circuit device 100 shifts from the standby mode to the normal operating mode, the reset circuit 70 causes the reset signal XPORB to transition from active to inactive. With this configuration, the characteristic adjustment data is reloaded from the non-volatile memory 40 into the storage circuit 60, and therefore, the oscillation circuit 10 can operate based on correct characteristic adjustment data upon returning from the standby mode. That is, even when the storage contents of the storage circuit 60 are broken due to an abnormality such as instantaneous interruption in the standby mode, correct characteristic adjustment data is reloaded into the storage circuit 60 upon returning from the standby mode.

Moreover, by providing such a reload function, the reset circuit 70 can be brought into the disable state in the standby mode. With this configuration, the consumption current of the oscillation circuit 10 and the reset circuit 70 is reduced in the standby mode, and a consumption current in the standby mode can be reduced.

Although a case in which the normal operating mode and the standby mode are switched based on the control signal EN input from the control terminal T2 has been described above, a subject to which the present disclosure is applied is not limited to this case. In a broad sense, the normal operating mode may be a first mode in which the circuit device 100 outputs the clock signal. In a broad sense, the standby mode may be a second mode in which the circuit device 100 does not output the clock signal in a state in which power is supplied to the circuit device 100. Moreover, a signal to switch between the first mode and the second mode is not limited to a signal that is input from outside the circuit device 100, and may be a signal that is generated inside the circuit device 100.

2. Reset Circuit

Figure 4:
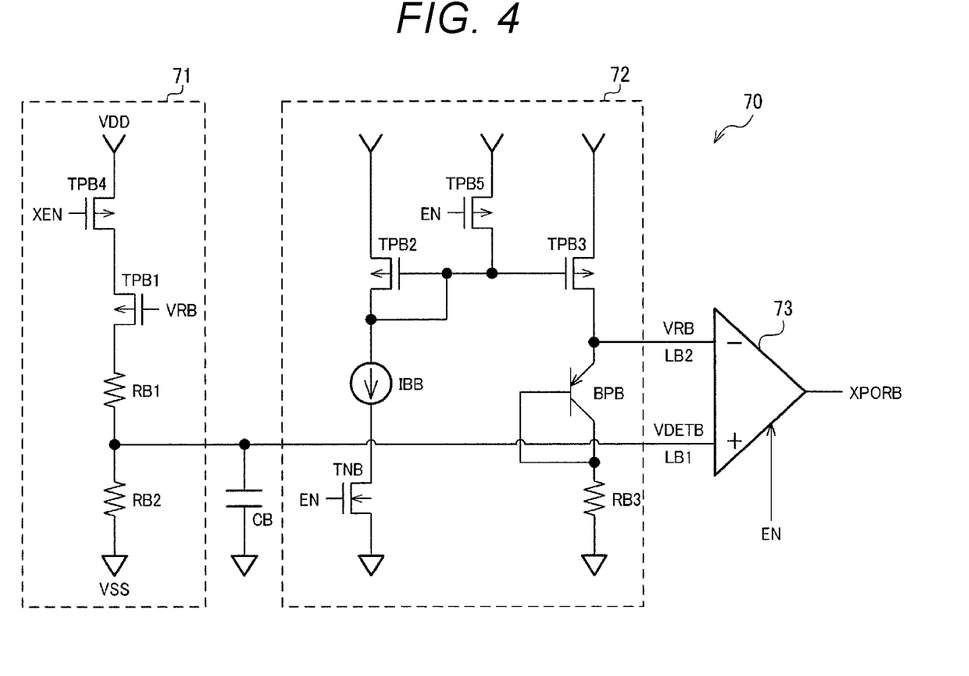
FIG. 4 is a detailed configuration example of a reset circuit in the embodiment.

FIG. 4 is a detailed configuration example of the reset circuit 70. The reset circuit 70 includes a voltage generating circuit 71 generating a first voltage VDETB, a reference voltage generating circuit 72 generating a reference voltage VRB, a comparator 73 comparing the first voltage VDETB with the reference voltage VRB, a capacitor CB, a first signal line LB1, and a second signal line LB2.

The voltage generating circuit 71 includes transistors TPB1 and TPB4 and resistors RB1 and RB2. The transistors TPB1 and TPB4 are P-type transistors.

A source of the transistor TPB4 is coupled to a node of the power supply voltage VDD, and a drain of the transistor TPB4 is coupled to a source of the transistor TPB1. A signal XEN that is a logic inversion signal of the control signal EN is input to a gate of the transistor TPB4. A drain of the transistor TPB1 is coupled to one end of the resistor RB1. The reference voltage VRB is input to a gate of the transistor TPB1. The other end of the resistor RB1 is coupled to one end of the resistor RB2, and the other end of the resistor RB1 serves as an output node of the voltage generating circuit 71. The other end of the resistor RB2 is coupled to a node of a ground voltage VSS.

In a broad sense, VDD is a high-potential side power supply voltage, and in a broad sense, VSS is a low-potential side power supply voltage. That is, it is sufficient that VDD is a voltage higher than VSS, and VSS is not limited to the ground voltage.

The reference voltage generating circuit 72 includes transistors TPB2, TPB3, TPB5, and TNB, a current source IBB, a bipolar transistor BPB, and a resistor RB3. The transistors TPB2, TPB3, and TPB5 are P-type transistors, and the transistor TNB is an N-type transistor.

The transistor TPB2 and the transistor TPB3 constitute a current mirror circuit. Specifically, the current source IBB feeds a current to the transistor TPB2, and the current is mirrored to the transistor TPB3. A source of the transistor TPB5 is coupled to the node of the power supply voltage VDD, and a drain of the transistor TPB5 is coupled to gates of the transistors TPB2 and TPB3. A drain of the transistor TNB is coupled to the current source IBB, and a source of the transistor TNB is coupled to the node of the ground voltage VSS. The control signal EN is input to a gate of the transistor TNB. An emitter of the bipolar transistor BPB is coupled to a drain of the transistor TPB3, and a node coupled to the emitter serves as an output node of the reference voltage generating circuit 72. A base of the bipolar transistor BPB is coupled to a collector of the bipolar transistor BPB and one end of the resistor RB3. The other end of the resistor RB3 is coupled to the node of the ground voltage VSS.

One end of the capacitor CB is coupled to the first signal line LB1, and the other end of the capacitor CB is coupled to the node of the ground voltage VSS.

The coupling in the embodiment is electrical coupling. The electrical coupling means that coupling is made to allow an electric signal to be transmitted, and is coupling through which the transmittance of information via the electric signal is possible. The electrical coupling may be coupling via a signal line, an active element, or the like.

The first signal line LB1 couples the output node of the voltage generating circuit 71 with a first input node of the comparator 73. The first input node is, for example, a non-inverting input node. The second signal line LB2 couples the output node of the reference voltage generating circuit 72 with a second input node of the comparator 73. The second input node is, for example, an inverting input node.

The comparator 73 compares the first voltage VDETB input to the first input node with the reference voltage VRB input to the second input node. When VDETB<VRB, the comparator 73 outputs the reset signal XPORB that is active; and when VDETB>VRB, the comparator 73 outputs the reset signal XPORB that is inactive. The comparator 73 is set into an enable state when the control signal EN is active, and set into the disable state when the control signal EN is inactive. The comparator 73 includes a switch for cutting off a current path from the node of the power supply voltage VDD to the node of the ground voltage VSS. The switch is turned off in the disable state, so that a current flowing from the node of the power supply voltage VDD to the node of the ground voltage VSS in the comparator 73 is cut off. With this configuration, the operation of the comparator 73 is stopped in the disable state.

Figure 5:
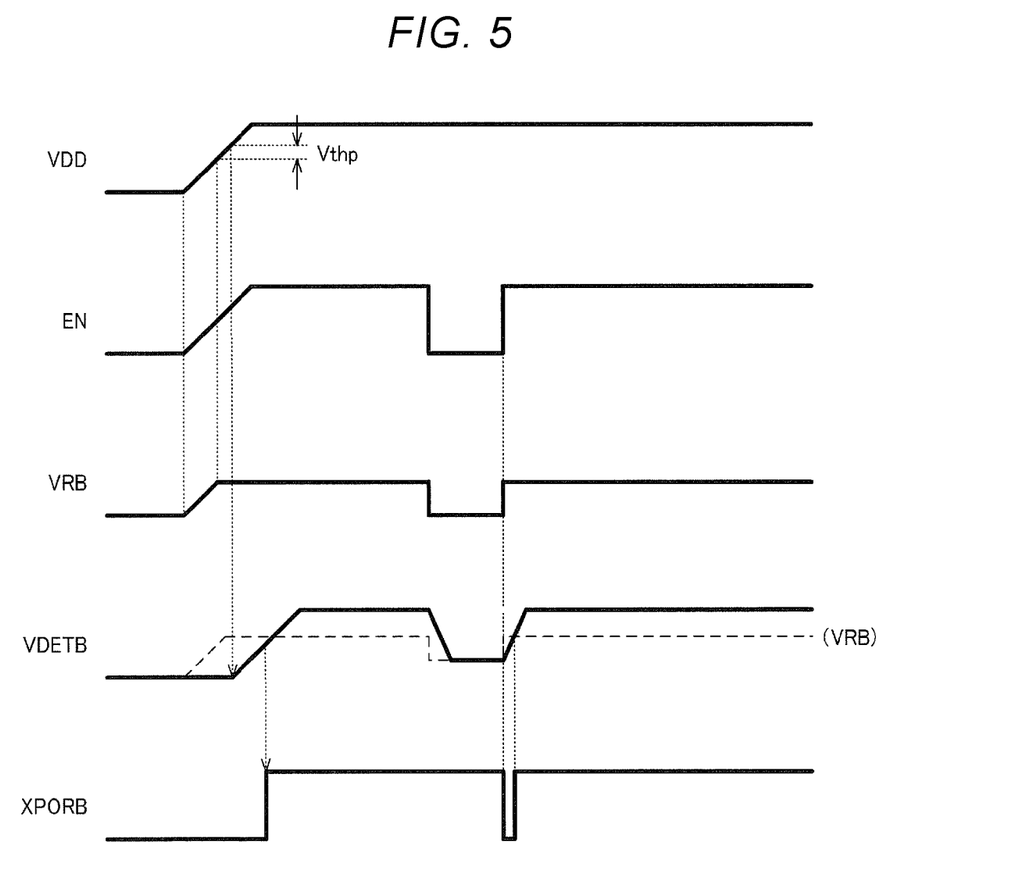
FIG. 5 is a waveform chart explaining the operation of the reset circuit in the embodiment.

FIG. 5 is a waveform chart explaining the operation of the reset circuit 70. It is assumed that the control signal EN is active at the time of power-on and is at the same signal level as that of the power supply voltage VDD. That is, the signal level of the control signal EN rises with the rise of the power supply voltage VDD.

When the power supply voltage VDD supplied to the reset circuit 70 rises, a mirror current flowing to the transistor TPB3 gradually increases, and the reference voltage VRB rises. The reference voltage VRB rises to a voltage determined by a base-emitter voltage of the bipolar transistor BPB and a voltage drop of the resistor RB3.

The reference voltage VRB is input to the gate of the transistor TPB1. A threshold voltage of the transistor TPB1 is defined as Vthp. When the power supply voltage VDD reaches VRB+Vthp, the transistor TPB1 is turned on, and the first voltage VDETB starts to rise. The first voltage VDETB is a voltage obtained by dividing the power supply voltage VDD by the resistors RB1 and RB2. When the first voltage VDETB exceeds the reference voltage VRB, an output signal of the comparator 73 transitions from the low level to the high level. This output signal is the reset signal XPORB. In the reset signal XPORB of FIG. 5, the low level corresponds to "active", and the high level corresponds to "inactive".

When the control signal EN transitions from the high level to the low level, the transistor TPB4 is turned off, and the first voltage VDETB becomes the ground voltage VSS. Moreover, the transistor TPB5 is turned on, and the transistor TNB is turned off. With this configuration, the transistors TPB2 and TPB3 are turned off, and therefore, the reference voltage VRB becomes the ground voltage VSS. In the control signal EN of FIG. 5, the high level corresponds to "active", and the low level corresponds to "inactive". When the control signal EN is at the low level, the comparator 73 is in the disable state, and the comparator 73 outputs the reset signal XPORB at the high level. That is, when the control signal EN is inactive, the circuit device 100 is in the reset release state, and the oscillation circuit 10 and the reset circuit 70 in FIG. 3 are brought into the disable state. This state is a state in the standby mode.

When the control signal EN transitions from the low level to the high level, the transistor TPB5 is turned off, and the transistor TNB is turned on. With this configuration, the current mirror circuit including the transistors TPB2 and TPB3 operates, and therefore, the reference voltage VRB rises. That is, the reference voltage VRB is a voltage determined by the base-emitter voltage of the bipolar transistor BPB and the voltage drop of the resistor RB3. Moreover, the transistor TPB4 is turned on, and therefore, a current flows to the resistors RB1 and RB2. At this time, the capacitor CB is coupled to the first signal line LB1, and therefore, the rise of the first voltage VDETB is slower than the rise of the reference voltage VRB. With this configuration, when the control signal EN transitions from the low level to the high level, VDETB<VRB, and thereafter, VDETB>VRB. The comparator 73 is in the enable state when the control signal EN is at the high level, and therefore, the reset signal XPORB is at the low level when the control signal EN transitions from the low level to the high level, and the reset signal XPORB is at the high level when VDETB>VRB.

As described above, when the control signal EN transitions from inactive to active, the reset circuit 70 makes the reset signal XPORB active, and then makes the reset signal XPORB inactive. That is, when the control signal EN transitions from inactive to active, the circuit device 100 is reset. With this configuration, the characteristic adjustment data is reloaded from the non-volatile memory 40 into the storage circuit 60 in FIG. 3.

3. Oscillator

Figure 6:
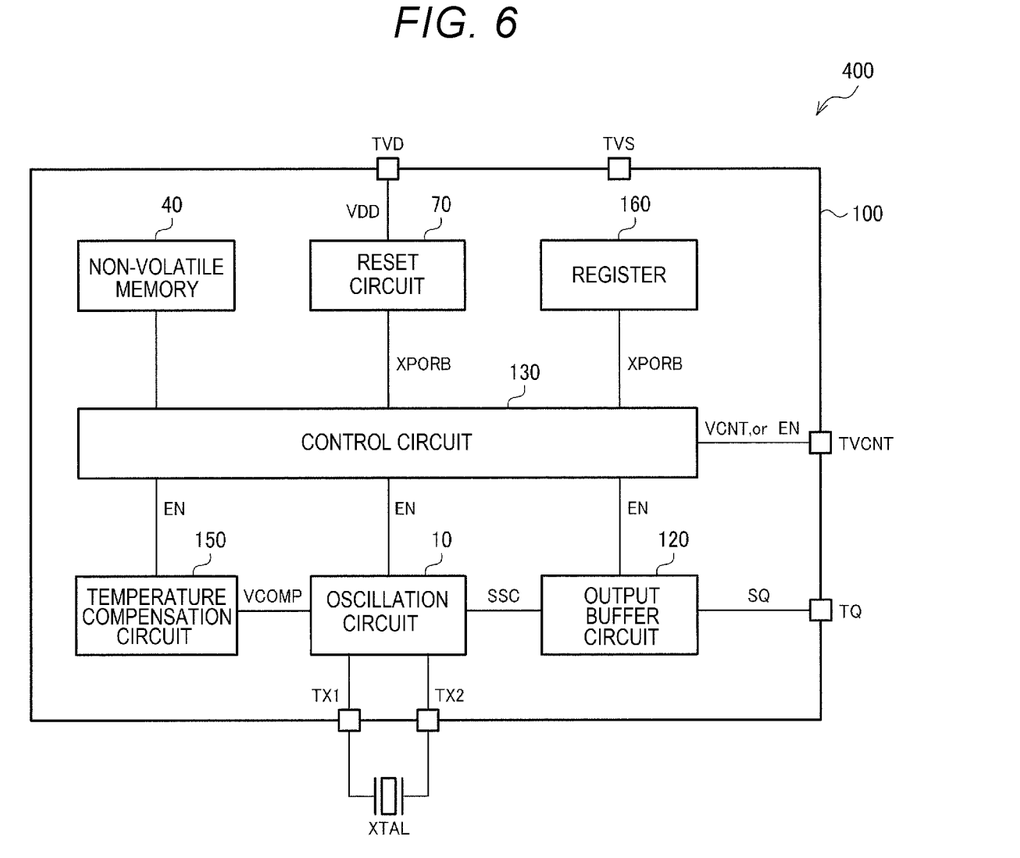
FIG. 6 is a configuration example of an oscillator.

FIG. 6 is a configuration example of an oscillator 400 including the circuit device 100. The oscillator 400 includes a resonator XTAL and the circuit device 100. For example, the resonator XTAL and the circuit device 100 are accommodated in a package, so that the oscillator 400 is configured.

The resonator XTAL is, for example, a piezoelectric resonator. The piezoelectric resonator is, for example, a quartz crystal resonator. The quartz crystal resonator is, for example, a quartz crystal resonator that has a cut angle such as AT cut or SC cut and that performs thickness-shear vibration. For example, the resonator is a resonator that is incorporated into a temperature-compensated crystal oscillator (TCXO) not including a temperature-controlled oven. Alternatively, the resonator may be a resonator that is incorporated into an oven-controlled crystal oscillator (OCXO) including a temperature-controlled oven. Moreover, a surface acoustic wave (SAW) resonator, a microelectro-mechanical systems (MEMS) resonator as a silicon-made resonator formed using a silicon substrate, or the like may be employed as the resonator.

The circuit device 100 includes the non-volatile memory 40, the reset circuit 70, the oscillation circuit 10, a register 160, a control circuit 130, a temperature compensation circuit 150, an output buffer circuit 120, and terminals TVD, TVS, TVCNT, TQ, TX1, and TX2. The circuit device 100 is, for example, an integrated circuit device. The terminals TVD, TVS, TVCNT, TQ, TX1, and TX2 are pads formed at a semiconductor substrate. The same components as the components described with reference to FIG. 3 and the like are denoted by the same reference numerals and signs, and the description of the components is appropriately omitted.

A control voltage VCNT or the control signal EN is input to the control terminal TVCNT. The function setting of the control terminal TVCNT is written in, for example, the non-volatile memory 40 or the like. Alternatively, by selecting a mask for forming a wiring layer according to the function of the control terminal TVCNT, the function of the control terminal TVCNT is determined. When the control voltage VCNT is input to the control terminal TVCNT, the control circuit 130 couples the control terminal TVCNT with the oscillation circuit 10, and inputs the control voltage VCNT to the oscillation circuit 10. When the control signal EN is input to the control terminal TVCNT, the control circuit 130 outputs the control signal EN to the temperature compensation circuit 150, the oscillation circuit 10, and the output buffer circuit 120.

The oscillation circuit 10 is coupled to the resonator XTAL via the terminal TX1 and the terminal TX2. The oscillation circuit 10 is a circuit for oscillating the resonator XTAL. The oscillation frequency is temperature-compensated by a temperature compensation voltage VCOMP. That is, the oscillation circuit 10 is controlled by the temperature compensation voltage VCOMP so that the oscillation frequency is constant even when the temperature changes. When the control voltage VCNT is input to the control terminal TVCNT, the oscillation circuit 10 oscillates at an oscillation frequency that is set by the control voltage VCNT.

For example, the oscillation circuit 10 is a Pierce oscillation circuit. In this case, the oscillation circuit 10 includes a bipolar transistor and a resistor coupled between a base and a collector of the bipolar transistor. The base of the bipolar transistor is coupled to the terminal TX1, and the collector is coupled to the terminal TX2. The oscillation circuit 10 includes a variable capacitance capacitor whose one end is coupled to the terminal TX1 or the terminal TX2. The temperature compensation voltage VCOMP is input to the other end of the variable capacitance capacitor, and the capacitance value of the variable capacitance capacitor is controlled by the temperature compensation voltage VCOMP. With this configuration, the oscillation frequency is temperature-compensated.

When the control signal EN is input to the control terminal TVCNT, the oscillation circuit 10 is set into the enable state or the disable state according to the control signal EN. For example, in the Pierce oscillation circuit, a switch is provided in a line through which a bias current is supplied to the bipolar transistor. When the control signal EN is inactive, the switch is turned off, and the oscillating operation of the oscillation circuit 10 is stopped.

The output buffer circuit 120 is a circuit that buffers an oscillation signal SSC from the oscillation circuit 10. That is, signal buffering is performed so that an external load can be sufficiently driven. The signal buffered by the output buffer circuit 120 is output as a clock signal SQ from the output terminal TQ to the outside of the oscillator 400. When the control signal EN is input to the control terminal TVCNT, the output buffer circuit 120 is set into the enable state or the disable state according to the control signal EN. For example, the output buffer circuit 120 includes a drive transistor that buffers the oscillation signal SSC to drive a load. When the control signal EN is inactive, the drive transistor is turned off, so that the operation of the output buffer circuit 120 is stopped.

The temperature compensation circuit 150 generates the temperature compensation voltage VCOMP based on a temperature detection result from a temperature sensor. Specifically, the temperature compensation circuit 150 generates, as the temperature compensation voltage VCOMP, a voltage of an approximation function with the temperature being as an argument. The approximation function is a function to compensate for the temperature characteristics of the resonator XTAL and the oscillation circuit 10. By generating the temperature compensation voltage VCOMP, the temperature compensation circuit 150 performs compensation so that the oscillation frequency of the oscillation circuit 10 is constant irrespective of temperature. A detailed configuration of the temperature compensation circuit 150 will be described later.

The control circuit 130 is a logic circuit. The control circuit 130 controls each part of the circuit device 100. Specifically, the control circuit 130 sets the circuit device 100 into the reset state or the reset release state based on the reset signal XPORB from the reset circuit 70. When the reset state is released according to the reset signal XPORB, the control circuit 130 loads the characteristic adjustment data from the non-volatile memory 40 into the register 160. Moreover, the control circuit 130 performs the operation setting of the temperature compensation circuit 150 and the oscillation circuit 10 based on the characteristic adjustment data stored in the register 160. The register 160 corresponds to the storage circuit 60 in FIG. 3.

The approximation function generated by the temperature compensation circuit 150 is a polynomial, and parameters representing the coefficients of the polynomial are stored as the characteristic adjustment data in the non-volatile memory 40. The parameters are loaded into the register 160, so that the approximation function generated by the temperature compensation circuit 150 is set. There are individual variations in the temperature characteristics of the resonator XTAL and the oscillation circuit 10, and therefore, there is an individual difference also in the approximation function. For this reason, when the parameters stored in the register 160 are not proper, temperature compensation is not correctly performed. In this regard, according to the embodiment, even in a case in which the storage contents of the register 160 are broken when the standby mode is set according to the control signal EN, the parameters are reloaded into the register 160 upon returning from the standby mode. With this configuration, at the time of returning from the standby mode, the oscillator 400 can output the clock signal that is correctly temperature-compensated.

The reset circuit 70 generates the reset signal XPORB based on the power supply voltage VDD input from the terminal TVD. When the control signal EN is input to the control terminal TVCNT, the reset circuit 70 generates the reset signal XPORB based on the power supply voltage VDD and the control signal EN. The operation of the reset circuit 70 is as described with reference to FIGS. 4 and 5.

Figure 7:
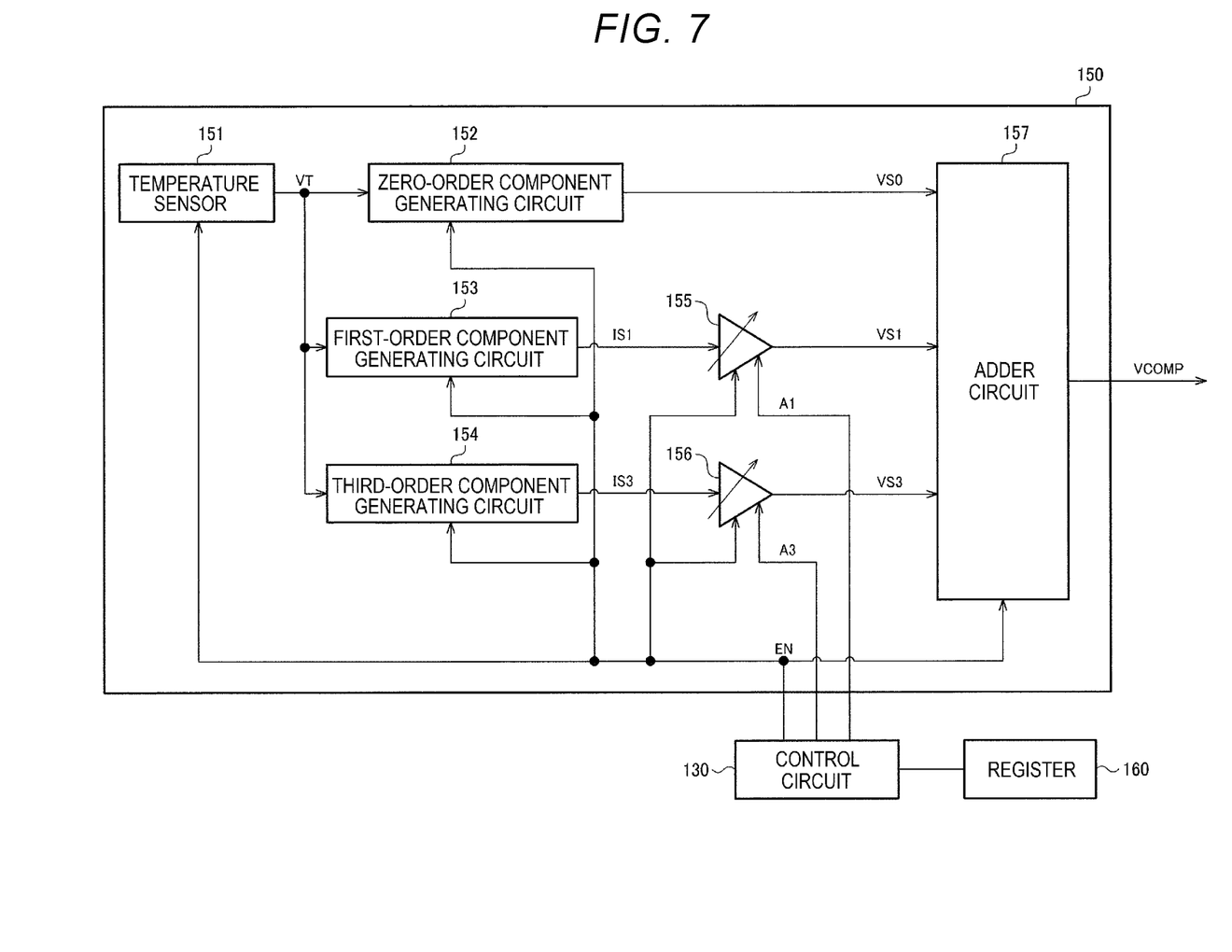
FIG. 7 is a detailed configuration example of a temperature compensation circuit.

FIG. 7 is a detailed configuration example of the temperature compensation circuit 150. The temperature compensation circuit 150 includes a temperature sensor 151, a zero-order component generating circuit 152, a first-order component generating circuit 153, a third-order component generating circuit 154, a first-order component gain adjusting circuit 155, a third-order component gain adjusting circuit 156, and an adder circuit 157. Although FIG. 7 shows a case in which the temperature compensation circuit 150 generates the temperature compensation voltage VCOMP of a cubic polynomial, the temperature compensation circuit 150 may generate the temperature compensation voltage VCOMP of a higher-order polynomial.

The temperature sensor 151 outputs a detection result of temperature as a temperature detection voltage VT. For example, the temperature sensor 151 is a circuit that outputs the temperature detection voltage VT based on a forward voltage of a P-N junction. The forward voltage of the P-N junction has temperature dependence.

The zero-order component generating circuit 152 outputs a zero-order component voltage VS0 approximating the zero-order component of temperature characteristics of the oscillation frequency of the resonator XTAL. The zero-order component generating circuit 152 includes a circuit that outputs a DC voltage, such as, for example, a resistance dividing circuit.

The first-order component generating circuit 153 outputs a first-order component current IS1 approximating the first-order component of temperature characteristics of the oscillation frequency of the resonator XTAL. The first-order component generating circuit 153 can be configured using, for example, a forward amplifier or the like. The first-order component gain adjusting circuit 155 performs a gain adjustment of the first-order component current IS1 based on a gain value A1 stored in the register 160, and outputs a first-order component voltage VS1=A1×IS1.

The third-order component generating circuit 154 outputs a third-order component current IS3 approximating the third-order component of temperature characteristics of the oscillation frequency of the resonator XTAL. The third-order component gain adjusting circuit 156 performs a gain adjustment of the third-order component current IS3 based on a gain value A3 stored in the register 160, and outputs a third-order component voltage VS3=A3×IS3.

The adder circuit 157 adds the zero-order component voltage VS0, the first-order component voltage VS1, and the third-order component voltage VS3, and outputs the temperature compensation voltage VCOMP. The adder circuit 157 is, for example, an analog adder circuit using an amplifier circuit. When VS0=A0, the temperature compensation voltage VCOMP is a voltage that approximates the following equation (1).

$$VCOMP = A3 \times (T-T0)^3 + A1 \times (T-T0) + A0 \qquad (1)$$

In the embodiment, the gain values A3, A1, and A0 are stored as temperature compensation data in the non-volatile memory 40. The temperature compensation data is the characteristic adjustment data. When the reset is released by power-on or the normal operating mode is returned from the standby mode, the gain values A3, A1, and A0 are loaded from the non-volatile memory 40 into the register 160.

The control circuit 130 outputs the control signal EN to the temperature sensor 151, the zero-order component generating circuit 152, the first-order component generating circuit 153, the third-order component generating circuit 154, the first-order component gain adjusting circuit 155, the third-order component gain adjusting circuit 156, and the adder circuit 157. When the control signal EN is inactive, these circuits are brought into the disable state. In the disable state, a bias current of an amplifier circuit or the like included in each circuit is cut off, so that the operation of each circuit is stopped.

4. Electronic Apparatus, Vehicle

Figure 8:
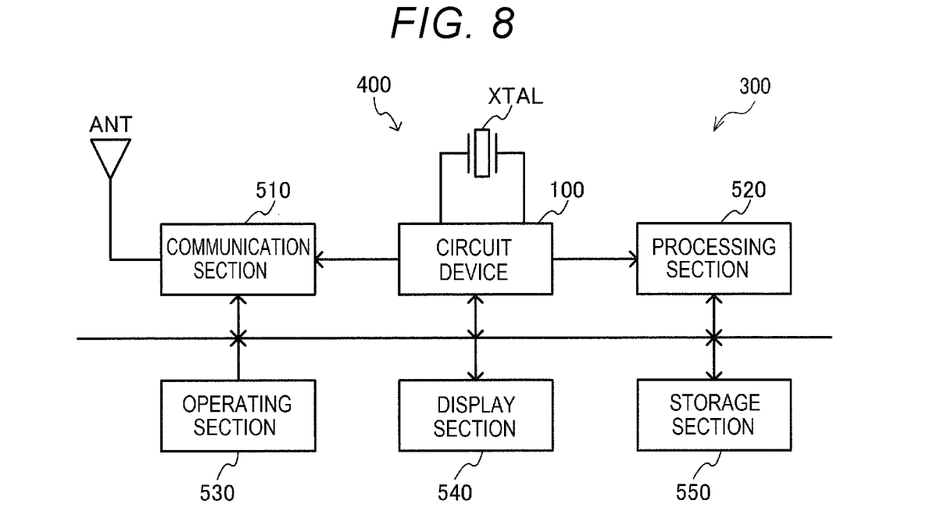
FIG. 8 is a configuration example of an electronic apparatus.

FIG. 8 is a configuration example of an electronic apparatus 300 including the circuit device 100. The electronic apparatus 300 includes the oscillator 400 including the circuit device 100 and the resonator XTAL, and a processing section 520. Moreover, the electronic apparatus 300 can include a communication section 510, an operating section 530, a display section 540, a storage section 550, and an antenna ANT.

Various apparatuses can be considered as the electronic apparatus 300. For example, a wearable apparatus such as a timepiece with a built-in GPS, a biological information measuring apparatus, or a head-mounted display device can be considered. The biological information measuring apparatus is a sphygmograph, a pedometer, or the like. Alternatively, a portable information terminal such as a smartphone, a mobile phone, a portable gaming device, a note PC, or a tablet PC can be considered. Alternatively, a content providing terminal that distributes contents, a video apparatus such as a digital camera or a video camcorder, a network-related apparatus such as a base station or a router, or the like can be considered. Alternatively, a measuring apparatus that measures a physical quantity such as distance, time, flow velocity or flow rate, a vehicle-mounted apparatus, a robot, or the like can be considered. The vehicle-mounted apparatus is an apparatus for automatic operation or the like.

The communication section 510 performs processing for receiving data from the outside or transmitting data to the outside via the antenna ANT. The communication section 510 is, for example, a communication circuit. The processing section 520 performs control processing on the electronic apparatus, various kinds of digital processing on data transmitted and received via the communication section 510, or the like. The function of the processing section 520 can be realized by a processor such as, for example, a microcomputer. The operating section 530 is used to perform an input operation by a user, and can be realized by an operating button, a touch panel display, or the like. The operating section 530 is, for example, an operating device. The display section 540 displays various kinds of information, and can be realized by a liquid crystal display, an organic EL display, or other display. The storage section 550 stores data, and the function of the storage section 550 can be realized by a semiconductor memory such as a RAM or a ROM, a hard disk drive, or the like.

Figure 9:
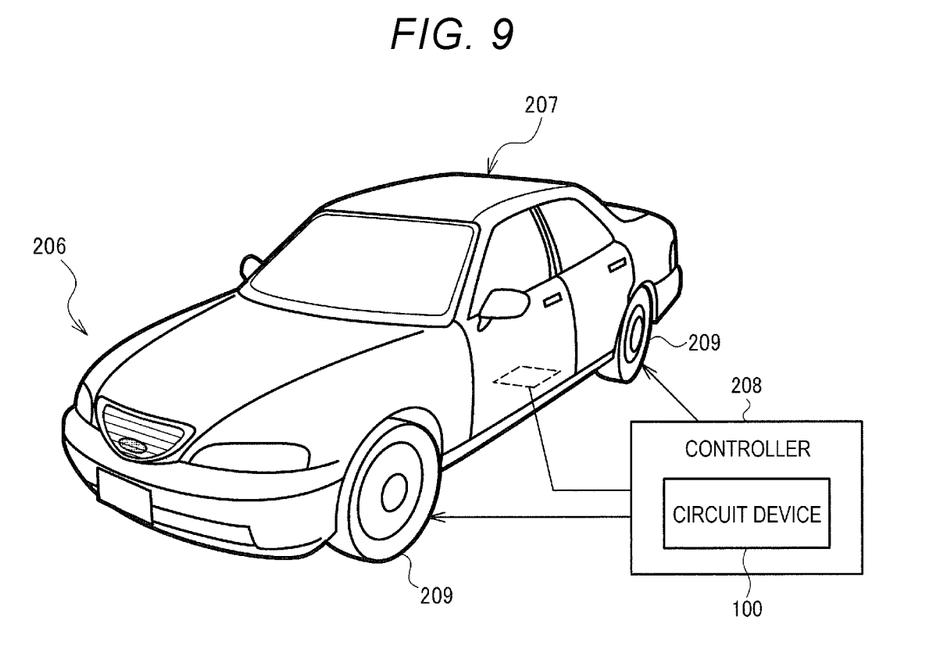
FIG. 9 is an example of a vehicle.

FIG. 9 is an example of a vehicle including the circuit device 100. The circuit device 100 can be incorporated into, for example, various vehicles such as a car, an airplane, a motorcycle, a bicycle, a robot, or a ship. The vehicle is a machine or apparatus that includes a drive mechanism such as, for example, an engine or a motor, a steering mechanism such as a steering wheel or a steering rudder, and various kinds of electronic apparatuses and that moves on the ground, in the sky, or at sea. FIG. 9 schematically shows an automobile 206 as a specific example of the vehicle. An oscillator (not shown) including the circuit device 100 is incorporated into the automobile 206. A controller 208 performs various kinds of control processing based on a clock signal generated by the oscillator. The controller 208 controls, for example, the hardness of a suspension according to the posture of a car body 207, or controls a brake of each wheel 209. An apparatus into which the circuit device 100 or the oscillator is incorporated is not limited to the controller 208, and the circuit device 100 or the oscillator can be incorporated into various apparatuses provided in a vehicle such as the automobile 206 or a robot.

According to the embodiment described above, a circuit device has a first mode in which the circuit device outputs a clock signal and a second mode in which the circuit device does not output the clock signal. The circuit device includes: an oscillation circuit generating the clock signal; a non-volatile memory in which characteristic adjustment data of the oscillation circuit is stored; a reset circuit generating a reset signal; and a storage circuit into which the characteristic adjustment data is loaded from the non-volatile memory when the reset signal transitions from active to inactive. The reset circuit causes the reset signal to transition from active to inactive when the circuit device shifts from the second mode to the first mode.

When the circuit device shifts from the second mode in which the circuit device does not output the clock signal to the first mode in which the circuit device outputs the clock signal, the reset circuit causes the reset signal to transition from active to inactive. The reset signal becomes inactive in this manner, so that the characteristic adjustment data is reloaded from the non-volatile memory into the storage circuit, and therefore, the oscillation circuit can operate based on correct characteristic adjustment data upon returning from the second mode to the first mode. Moreover, by providing such a reload function, the reset circuit can be brought into a disable state in the second mode. That is, even when the characteristic adjustment data stored in the storage circuit is broken due to an abnormality such as instantaneous interruption in the second mode, the characteristic adjustment data is reloaded into the storage circuit upon returning from the second mode to the first mode. The reset circuit can be brought into the disable state in the second mode, so that the consumption current of the oscillation circuit and the reset circuit is reduced in a standby mode, and the consumption current of the circuit device in the standby mode can be reduced.

In an embodiment, the circuit device may include a control terminal to which a control signal to switch between the first mode and the second mode is input. The reset circuit may cause the reset signal to transition from active to inactive at the time of power-on, and causes, after power-on, the reset signal to transition from active to inactive when the circuit device shifts from the second mode to the first mode.

According to the embodiment, the reset circuit causing the reset signal to transition from active to inactive at the time of power-on can generate, after power-on, the reset signal based on the control signal. That is, in a state in which power is supplied to the circuit device, when the circuit device is brought into the second mode by terminal control and then brought into the first mode by terminal control, the circuit device can be reset according to the reset signal. With this configuration, the characteristic adjustment data can be reloaded from the non-volatile memory into the storage circuit.

In an embodiment, the first mode may be a normal operating mode of the circuit device. The second mode may be a standby mode of the circuit device.

According to the embodiment, when the circuit device returns from the standby mode to the normal operating mode, the reset circuit makes the reset signal active and then makes the reset signal inactive. With this configuration, the characteristic adjustment data is reloaded from the non-volatile memory into the storage circuit, and therefore, the oscillation circuit can operate based on correct characteristic adjustment data upon returning from the standby mode to the normal operating mode.

In an embodiment, the reset circuit may cause the reset signal to transition from active to inactive at the time of power-on. The reset circuit may be set into a disable state in the second mode after power-on.

According to the embodiment, the reset circuit is set into the disable state in the second mode after power-on, so that the consumption current of the reset circuit in the second mode is reduced. In addition, when the circuit device shifts from the second mode to the first mode, the reset circuit makes the reset signal active and then makes the reset signal inactive. With this configuration, the characteristic adjustment data is reloaded from the non-volatile memory into the storage circuit, and therefore, the oscillation circuit can operate based on correct characteristic adjustment data upon returning from the second mode to the first mode.

In an embodiment, the reset circuit may include a voltage generating circuit generating a first voltage obtained by voltage-dividing a power supply voltage, a reference voltage generating circuit generating a reference voltage, and a comparator. The comparator may compare the first voltage with the reference voltage and output the reset signal based on a comparison result.

The first voltage is obtained by voltage-dividing the power supply voltage, and therefore, the first voltage rises with the rise of the power supply voltage at power-on. The first voltage and the reference voltage are compared, so that the reset signal transitioning from active to inactive at the time of power-on is output.

In an embodiment, the voltage generating circuit, the reference voltage generating circuit, and the comparator may be set into the disable state in the second mode.

According to the embodiment, the voltage generating circuit, the reference voltage generating circuit, and the comparator are set into the disable state in the second mode, so that the reset circuit is set into the disable state.

In an embodiment, the reset circuit may include a first signal line, a second signal line, and a capacitor. The first signal line may couple an output node of the voltage generating circuit with a first input node of the comparator, the first input node receiving the first voltage. The second signal line may couple an output node of the reference voltage generating circuit with a second input node of the comparator, the second input node receiving the reference voltage. One end of the capacitor may be coupled to the first signal line.

The one end of the capacitor is coupled to the first signal line, so that the rise of the first voltage is slower than the rise of the reference voltage. With this configuration, when the reset circuit returns from the disable state to the enable state, the first voltage rises after the reference voltage rises. With this configuration, when the circuit device shifts from the second mode to the first mode, the reset circuit can make the reset signal active and then make the reset signal inactive.

In an embodiment, when the circuit device shifts from the second mode to the first mode, the voltage generating circuit may raise a voltage level of the first voltage after the reference voltage generating circuit outputs the reference voltage.

According to the embodiment, when the reset circuit returns from the disable state to the enable state, the first voltage rises after the reference voltage rises. With this configuration, when the circuit device shifts from the second mode to the first mode, the reset circuit can make the reset signal active and then make the reset signal inactive.

In an embodiment, the characteristic adjustment data may be temperature compensation data of an oscillation frequency of the oscillation circuit.

According to the embodiment, when the circuit device returns from the second mode to the first mode, the temperature compensation data is reloaded from the non-volatile memory into the storage circuit. With this configuration, temperature compensation of the oscillation frequency is performed based on correct temperature compensation data upon returning from the second mode to the first mode, and therefore, a clock signal at an accurate oscillation frequency is output.

In an embodiment, the circuit device may include a temperature compensation circuit performing temperature compensation of the oscillation frequency based on the temperature compensation data. The temperature compensation circuit may be set into the disable state in the second mode.

According to the embodiment, the temperature compensation circuit is set into the disable state in the second mode, so that the consumption current of the circuit device in the second mode can be reduced.

In an embodiment, the oscillation circuit may be set into the disable state in the second mode.

According to the embodiment, the oscillation circuit is set into the disable state in the second mode, so that the consumption current of the circuit device in the second mode can be reduced.

In an embodiment, an oscillator includes the circuit device according to any of the embodiments and a resonator that is coupled to the oscillation circuit and that oscillates.

In an embodiment, an electronic apparatus includes the circuit device according to any of the embodiments.

In an embodiment, a vehicle includes the circuit device according to any of the embodiments.

Although the embodiments have been described above in detail, those skilled in the art should readily understand that many modifications can be made without substantially departing from the novel matter and effects of the present disclosure. Accordingly, all of those modified examples are deemed to be included in the scope of the present disclosure. For example, the terms mentioned in the specification or the drawings at least once together with different terms in a broader sense or a similar sense may be replaced with the different terms in any part of the specification or the drawings. Moreover, all of the combinations of the embodiments and the modified examples are also included in the scope of the present disclosure. Moreover, the configurations, operations, and the like of the circuit device, the oscillator, the electronic apparatus, the vehicle, and the like are not limited to those described in the embodiments, and various modifications can be implemented.

What is claimed is:

1. A circuit device having a first mode in which the circuit device outputs a clock signal and a second mode in which the circuit device does not output the clock signal, the circuit device comprising:
    an oscillation circuit generating the clock signal;
    a non-volatile memory in which characteristic adjustment data of the oscillation circuit is stored;
    a reset circuit generating a reset signal; and
    a storage circuit into which characteristic adjustment data is loaded from the non-volatile memory when the reset signal transitions from active to inactive, wherein
    the reset circuit causes the reset signal to transition from active to inactive when the circuit device shifts from the second mode to the first mode,
    the first mode is a normal operating mode of the circuit device, and
    the second mode is a standby mode of the circuit device.

2. The circuit device according to claim 1, wherein the reset circuit causes the reset signal to transition from active to inactive at the time of power-on, and is set into a disable state in the second mode after power-on.

3. The circuit device according to claim 1, wherein the reset circuit includes
    a voltage generating circuit generating a first voltage obtained by voltage-dividing a power supply voltage,
    a reference voltage generating circuit generating a reference voltage, and
    a comparator that compares the first voltage with the reference voltage and that outputs the reset signal based on a comparison result.

4. The circuit device according to claim 3, wherein the voltage generating circuit, the reference voltage generating circuit, and the comparator are set into the disable state in the second mode.

5. The circuit device according to claim 3, wherein the reset circuit includes
    a first signal line coupling an output node of the voltage generating circuit with a first input node of the comparator, the first input node receiving the first voltage,
    a second signal line coupling an output node of the reference voltage generating circuit with a second input node of the comparator, the second input node receiving the reference voltage, and
    a capacitor whose one end is coupled to the first signal line.

6. The circuit device according to claim 3, wherein when the circuit device shifts from the second mode to the first mode, the voltage generating circuit raises a voltage level of the first voltage after the reference voltage generating circuit outputs the reference voltage.

7. The circuit device according to claim 1, wherein the characteristic adjustment data is temperature compensation data of an oscillation frequency of the oscillation circuit.

8. The circuit device according to claim 7, further comprising a temperature compensation circuit performing temperature compensation of the oscillation frequency based on the temperature compensation data, wherein
    the temperature compensation circuit is set into the disable state in the second mode.

9. The circuit device according to claim 7, wherein the oscillation circuit is set into the disable state in the second mode.

10. An oscillator comprising:
    the circuit device according to claim 1; and
    a resonator that is coupled to the oscillation circuit and that oscillates.

11. An electronic apparatus comprising the circuit device according to claim 1.

12. A vehicle comprising the circuit device according to claim 1.

13. A circuit device having a first mode in which the circuit device outputs a clock signal and a second mode in which the circuit device does not output the clock signal, the circuit device comprising:
    an oscillation circuit generating the clock signal;

a non-volatile memory in which characteristic adjustment data of the oscillation circuit is stored;

a reset circuit generating a reset signal;

a storage circuit into which the characteristic adjustment data is loaded from the non-volatile memory when the reset signal transitions from active to inactive; and a control terminal to which a control signal to switch between the first mode and the second mode is input, wherein the reset circuit causes the reset signal to transition from active to inactive at the time of power-on, and causes, after power-on, the reset signal to transition from active to inactive when the circuit device shifts from the second mode to the first mode.

* * * * *